US007642622B2

(12) United States Patent
Yi et al.

(10) Patent No.: US 7,642,622 B2
(45) Date of Patent: Jan. 5, 2010

(54) PHASE CHANGEABLE MEMORY CELLS AND METHODS OF FORMING THE SAME

(75) Inventors: Ji-Hye Yi, Yongin-si (KR); Byeong-Ok Cho, Seoul (KR); Sung-Lae Cho, Gwacheon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 241 days.

(21) Appl. No.: 11/288,672

(22) Filed: Nov. 29, 2005

(65) Prior Publication Data

US 2006/0118913 A1    Jun. 8, 2006

(30) Foreign Application Priority Data

Dec. 6, 2004    (KR) .................. 10-2004-0101999

(51) Int. Cl.
*H01L 29/22*    (2006.01)
(52) U.S. Cl. ............... 257/613; 257/758; 257/E39.029
(58) Field of Classification Search ............... 257/613, 257/E31.029, 758
See application file for complete search history.

(56) References Cited

U.S. PATENT DOCUMENTS

| 5,831,276 | A | * | 11/1998 | Gonzalez et al. ............. 257/3 |
| 6,147,395 | A | | 11/2000 | Gilgen |
| 6,545,903 | B1 | * | 4/2003 | Wu ............................ 365/148 |
| 2003/0178727 | A1 | * | 9/2003 | Ikeda et al. ................. 257/758 |
| 2003/0189200 | A1 | | 10/2003 | Lee et al. |
| 2003/0209746 | A1 | | 11/2003 | Horii |
| 2004/0037179 | A1 | | 2/2004 | Lee |
| 2004/0085833 | A1 | | 5/2004 | Hwang et al. |
| 2004/0087074 | A1 | | 5/2004 | Hwang et al. |
| 2004/0113181 | A1 | * | 6/2004 | Wicker ....................... 257/246 |
| 2004/0165422 | A1 | * | 8/2004 | Hideki et al. ................. 365/163 |
| 2004/0166604 | A1 | | 8/2004 | Ha et al. |

(Continued)

FOREIGN PATENT DOCUMENTS

EP    1480273    8/2006

(Continued)

OTHER PUBLICATIONS

Combined Search and Examination Report under Sections 17 & 18(3) for Application No. GB0624408.1.

(Continued)

*Primary Examiner*—Bradley K Smith
*Assistant Examiner*—Mohammad T Karimy
(74) *Attorney, Agent, or Firm*—F. Chau & Associates, LLC

(57) ABSTRACT

A phase changeable memory cell is provided. The phase changeable memory cell includes a lower interlayer dielectric layer formed on a semiconductor substrate and a lower conductive plug passing through the lower interlayer dielectric layer. The lower conductive plug is in contact with a phase change material pattern disposed on the lower interlayer dielectric layer. The phase change material pattern and the lower interlayer dielectric layer are covered with an upper interlayer dielectric layer. The phase change material pattern is in direct contact with a conductive layer pattern, which is disposed in a plate line contact hole passing through the upper interlayer dielectric layer. Methods of fabricating the phase changeable memory cell is also provided.

13 Claims, 6 Drawing Sheets

U.S. PATENT DOCUMENTS

2004/0234895 A1 11/2004 Lee et al.
2005/0139816 A1 6/2005 Jeong et al.

FOREIGN PATENT DOCUMENTS

| KR | 2003-0086820 | 11/2003 |
| KR | 10-2004-0038421 | 5/2004 |
| KR | 10-2004-0054250 A | 6/2004 |

OTHER PUBLICATIONS

English Translation of First Office Action for Chinese Patent Appln. No. 200510129743X.

* cited by examiner

PHASE CHANGEABLE MEMORY CELLS AND METHODS OF FORMING THE SAME

This application claims the benefit of Korean Patent Application No. 10-2004-0101999, filed Dec. 6, 2004, the contents of which are hereby incorporated herein by reference in their entirety.

BACKGROUND OF THE INVENTION

1. Field of the Invention

The present invention relates to semiconductor devices and methods of forming the same and, more particularly, to phase changeable memory cells and methods of forming the same.

2. Description of Related Art

Nonvolatile memory devices retain their stored data even when their power supplies are turned off and thus nonvolatile memory devices have been widely used in conjunction with computers, mobile telecommunication systems, memory cards and so on. For example, one widely used type of nonvolatile memory device is the flash memory device. Many flash memory devices employ memory cells having a stacked gate structure. The stacked gate structure of a flash memory device typically includes a tunnel oxide layer, a floating gate, an inter-gate dielectric layer and a control gate electrode, which are all sequentially stacked on a channel region. Further, to enhance the reliability and program efficiency of flash memory cells, the film quality of the tunnel oxide layer should be improved and the coupling ratio of the flash memory cell should be increased.

Recently, other types of nonvolatile memory devices, for example, phase changeable memory devices are being used in place of flash memory devices. A unit cell of a phase changeable memory device typically includes a switching device and a data storage element serially connected to the switching device. The data storage element of a phase changeable memory device includes a lower electrode electrically connected to the switching device, a phase change material pattern disposed on the lower electrode, and an upper electrode disposed on the phase change material pattern. In general, the lower electrode functions as a heater. For instance, when a write current flows through the switching device and the lower electrode, heat, measured in joule energy units, is generated at an interface between the phase change material pattern and the lower electrode. The heat measured in joule energy units converts the phase change material pattern into an amorphous state or a crystalline state.

FIG. 1 is a cross-sectional view illustrating a portion of a conventional phase changeable memory cell.

Referring to FIG. 1, a lower interlayer dielectric layer 3 is provided on a semiconductor substrate 1. The semiconductor substrate 1 is electrically connected to a contact plug 5, which passes through the lower interlayer dielectric layer 3. The contact plug 5 acts as a lower electrode. A phase change material pattern 7 is stacked on the lower interlayer dielectric layer 3 to cover the lower electrode 5 In addition, a top surface of the phase change material pattern 7 is in contact with an upper electrode 9. The upper electrode 9 is self-aligned with the phase change material pattern 7 to have the same width as the phase change material pattern 7.

The phase change material pattern 7 may be formed of a chalcogenide material layer, such as a GeSbTe layer (hereinafter, referred to as a GST layer). The GST layer easily reacts with a conductive material layer, such as a polysilicon (poly-Si) layer. For example, when the GST layer is in direct contact with a poly-Si layer, silicon atoms in the poly-Si layer permeate into the GST layer thereby increasing the resistance of the GST layer. As a result, the characteristics of the GST layer are degraded. Accordingly, the lower and upper electrodes 5 and 9, which are in direct contact with the phase change material pattern 7, are formed of stable conductive layers that do not react with the phase change material pattern 7. For example, a metal nitride layer such as a titanium nitride layer is widely used in formation of the lower and upper electrodes 5 and 9.

Moreover, the entire surface of the semiconductor substrate 1 having the upper electrode 9 is covered with an upper interlayer dielectric layer 11. A plate line 13 is disposed on the upper interlayer dielectric layer 11 and electrically connected to the upper electrode 9 through a plate line contact hole 11a that passes through the upper interlayer dielectric layer 11.

To store desired data in a phase changeable memory cell having the phase change material pattern 7, a write current IW should flow through the upper electrode 9, the phase change material pattern 7 and the lower electrode 5. A portion 7a of the phase change material pattern 7, which is in contact with the lower electrode 5, may be changed to a crystalline or amorphous state according to the amount of the write current IW. Also, the plate line contact hole 11a may typically have a width smaller than that of the upper electrode 9. However, despite the above-mentioned variations which may be made to the conventional phase change memory cell, the write current IW will still uniformly flow through the entire region of the upper electrode 9 as shown in FIG. 1 because the upper electrode 9 has a lower resistivity than the phase change material pattern 7. Therefore, the write current density in the bulk region of the phase change material pattern 7 of the above conventional phase change memory cell is lower than at the interface between the lower electrode 5 and the phase change material pattern 7 thereby degrading the phase transition efficiency in the bulk region of the phase change material pattern 7 of these conventional devices.

Another conventional phase changeable memory cell is disclosed in U.S. Pat. No. 6,545,903 to Wu, entitled "Self-Aligned Resistive Plugs for Forming Memory Cell with Phase Change Material". The phase changeable memory cell described in the Wu patent includes a first highly resistive material layer and a second highly resistive material layer which are provided underneath and on top of a phase change material layer respectively In addition, a first low resistive plug and a second low resistive plug, which are self-aligned with each other, are disposed in the first and second highly resistive material layers, respectively. The first and second highly resistive material layers are formed of poly-Si or amorphous silicon (a-Si), and the self-aligned low resistive plugs are formed by implanting impurity ions into the highly resistive material layers using an ion implantation process. Consequently, the phase change material layer of the phase changeable memory cell described in the Wu patent is in direct contact with silicon layers, which in turn causes the characteristics of the interfaces between the phase change material layer and the silicon layers of this conventional memory cell to be unstable.

SUMMARY OF THE INVENTION

In an exemplary embodiment of the invention, a phase changeable memory cell is provided. The phase changeable memory cell includes a lower interlayer dielectric layer formed on a semiconductor substrate and a lower conductive plug passing through the lower interlayer dielectric layer. A phase change material pattern is disposed on the lower interlayer dielectric layer and in contact with the lower conductive plug. The phase change material pattern and the lower interlayer dielectric layer are covered with an upper interlayer dielectric layer. The phase change material pattern is in direct contact with a conductive layer pattern through a plate line contact hole that penetrates through the upper interlayer dielectric layer.

In another exemplary embodiment of the invention, a phase changeable memory cell is provided. The phase changeable memory cell includes an isolation layer formed in a predetermined region of a semiconductor substrate to define an active region. A switching device is provided at the active region. A lower interlayer dielectric layer is provided on the substrate having the switching device. The switching device is electrically connected to a lower conductive plug passing through the lower interlayer dielectric layer. A phase change material pattern is disposed on the lower interlayer dielectric layer and in contact with the lower conductive plug. The phase change material pattern and the lower interlayer dielectric layer are covered with an upper interlayer dielectric layer. A plate line is disposed on the upper interlayer dielectric layer and in direct contact with the phase change material pattern through a plate line contact hole that passes through the upper interlayer dielectric layer.

In another exemplary embodiment of the invention, a phase changeable memory cell is provided. The phase changeable memory cell includes an isolation layer formed in a predetermined region of a semiconductor substrate to define an active region. A switching device is provided at the active region. A lower interlayer dielectric layer is provided on the substrate having the switching device. The switching device is electrically connected to a lower conductive plug passing through the lower interlayer dielectric layer. A phase change material pattern is disposed on the lower interlayer dielectric layer and in contact with the lower conductive plug. The phase change material pattern and the lower interlayer dielectric layer are covered with an upper interlayer dielectric layer. The phase change material pattern is in direct contact with an upper conductive plug that fills a plate line contact hole passing through the upper interlayer dielectric layer. A plate line is disposed on the upper interlayer dielectric layer and the plate line is electrically connected to the upper conductive plug.

In another exemplary embodiment, a phase changeable memory cell is provided. The phase changeable memory cell includes a lower interlayer dielectric layer formed on a semiconductor substrate and a lower conductive plug passing through the lower interlayer dielectric layer. A lower electrode is disposed on the lower interlayer dielectric layer and the lower electrode is in contact with the lower conductive plug. The lower electrode and the lower interlayer dielectric layer are covered with a molding layer. A phase change material pattern is disposed on the molding layer and the phase change material pattern is in contact with the lower electrode through a phase change material contact hole that passes through the molding layer. An upper interlayer dielectric layer is disposed on the substrate having the phase change material pattern. The phase change material pattern is in direct contact with a conductive layer pattern through a plate line contact hole that passes through the upper interlayer dielectric layer.

In another exemplary embodiment of the invention, a phase changeable memory cell is provided. The phase changeable memory cell includes an isolation layer formed in a predetermined region of a semiconductor substrate to define an active region. A switching device is provided at the active region. A lower interlayer dielectric layer is disposed on the substrate having the switching device. The switching device is electrically connected to a lower conductive plug passing through the lower interlayer dielectric layer. A lower electrode is disposed on the lower interlayer dielectric layer and the lower electrode is in contact with the lower conductive plug. The lower electrode and the lower interlayer dielectric layer are covered with a molding layer. A phase change material pattern is disposed on the molding layer and the phase change material pattern is in contact with the lower electrode through a phase change material contact hole that passes through the molding layer. An upper interlayer dielectric layer is disposed on the substrate having the phase change material pattern. A plate line is disposed on the upper interlayer dielectric layer and the plate line is in direct contact with the phase change material pattern through a plate line contact hole that passes through the upper interlayer dielectric layer.

In another exemplary embodiment of the invention, a phase changeable memory cell is provided. The phase changeable memory cell includes an isolation layer formed in a predetermined region of a semiconductor substrate to define an active region. A switching device is provided at the active region. A lower interlayer dielectric layer is disposed on the substrate having the switching device. The switching device is electrically connected to a lower conductive plug passing through the lower interlayer dielectric layer. A lower electrode is disposed on the lower interlayer dielectric layer and the lower electrode is in contact with the lower conductive plug. The lower electrode and the lower interlayer dielectric layer are covered with a molding layer. A phase change material pattern is disposed on the molding layer and the phase change material pattern is in contact with the lower electrode through a phase change material contact hole that passes through the molding layer. An upper interlayer dielectric layer is disposed on the substrate having the phase change material pattern. The phase change material pattern is in direct contact with an upper conductive plug that fills a plate line contact hole passing through the upper interlayer dielectric layer. A plate line is disposed on the upper interlayer dielectric layer and the plate line is electrically connected to the upper conductive plug.

In another exemplary embodiment of the invention, a method of forming a phase changeable memory cell is provided. The method includes forming a lower interlayer dielectric layer on a semiconductor substrate and forming a lower conductive plug passing through the lower interlayer dielectric layer. A phase change material pattern is formed on the lower interlayer dielectric layer. The phase change material pattern is formed to contact the lower conductive plug. An upper interlayer dielectric layer is formed on the phase change material pattern and the lower interlayer dielectric layer. The upper interlayer dielectric layer is patterned to form a plate line contact hole that exposes a portion of the phase change material pattern. A conductive layer pattern is formed to be in direct contact with the exposed portion of the phase change material pattern through the plate line contact hole.

In yet another exemplary embodiment, a method of forming a phase changeable memory cell is provided. The method includes forming a lower interlayer dielectric layer on a semiconductor substrate and forming a lower conductive plug passing through the lower interlayer dielectric layer. A lower electrode is formed on the lower interlayer dielectric layer to contact the lower conductive plug. A molding layer is formed on the lower electrode and the lower interlayer dielectric layer. The molding layer is patterned to form a phase change material contact hole that exposes the lower electrode. A phase change material pattern is formed on the molding layer. The phase change material pattern is formed to be in contact with the lower electrode through the phase change material contact hole. An upper interlayer dielectric layer is formed on the substrate having the phase change material pattern. The upper interlayer dielectric layer is patterned to form a plate line contact hole that exposes a portion of the phase change material pattern. A conductive layer pattern is formed to be in direct contact with the exposed portion of the phase change material pattern through the plate line contact hole.

DETAILED DESCRPTION OF THE EXEMPLARY EMBODIMENTS OF THE INVENTION

Figure 1:
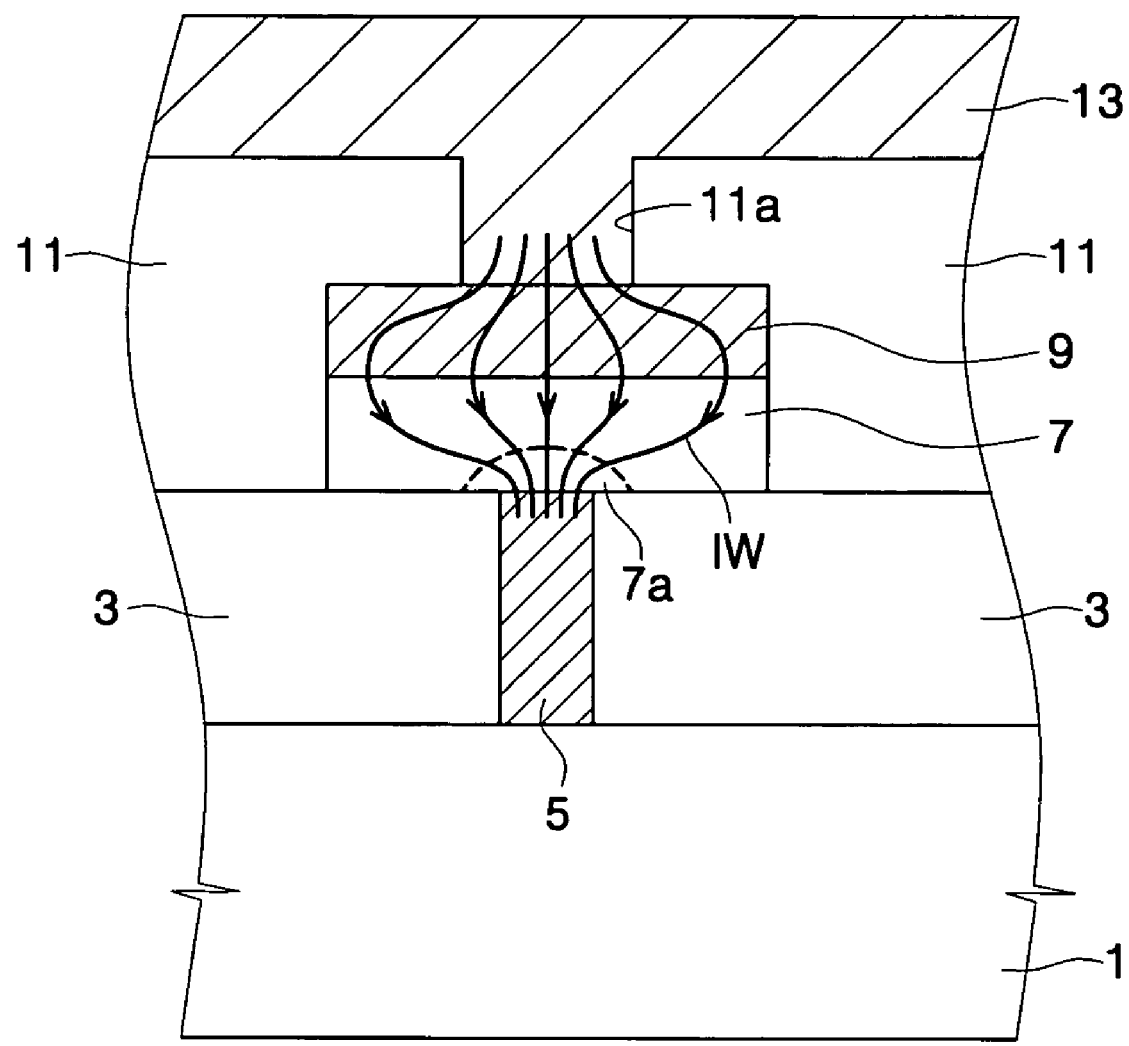
FIG. 1 is a cross-sectional view of a conventional phase changeable memory cell.

The exemplary embodiments of the present invention will now be described more fully hereinafter with reference to the accompanying drawings, in which exemplary embodiments of the invention are shown. This invention may, however, be embodied in different forms and should not be construed as limited to the embodiments set forth herein. In the drawings, the thicknesses of layers and regions are exaggerated for clarity. The same reference numerals are used to denote the same elements throughout the specification.

Figure 2A:
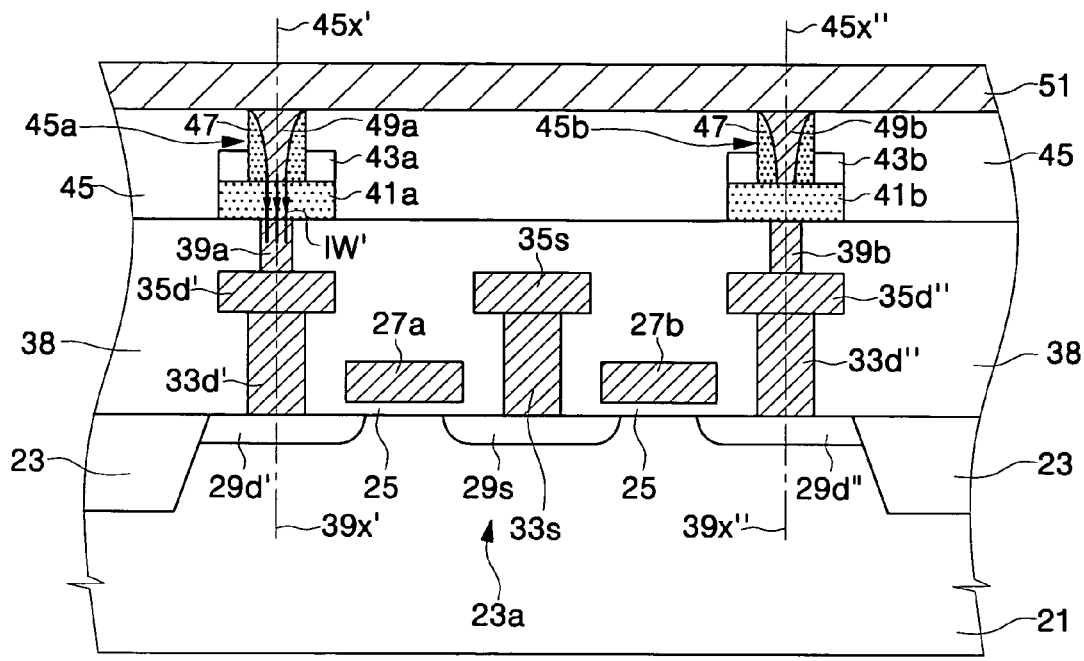
FIG. 2A is a cross-sectional view illustrating a pair of phase changeable memory cells according to an exemplary embodiment of the present invention.
Figure 2B:
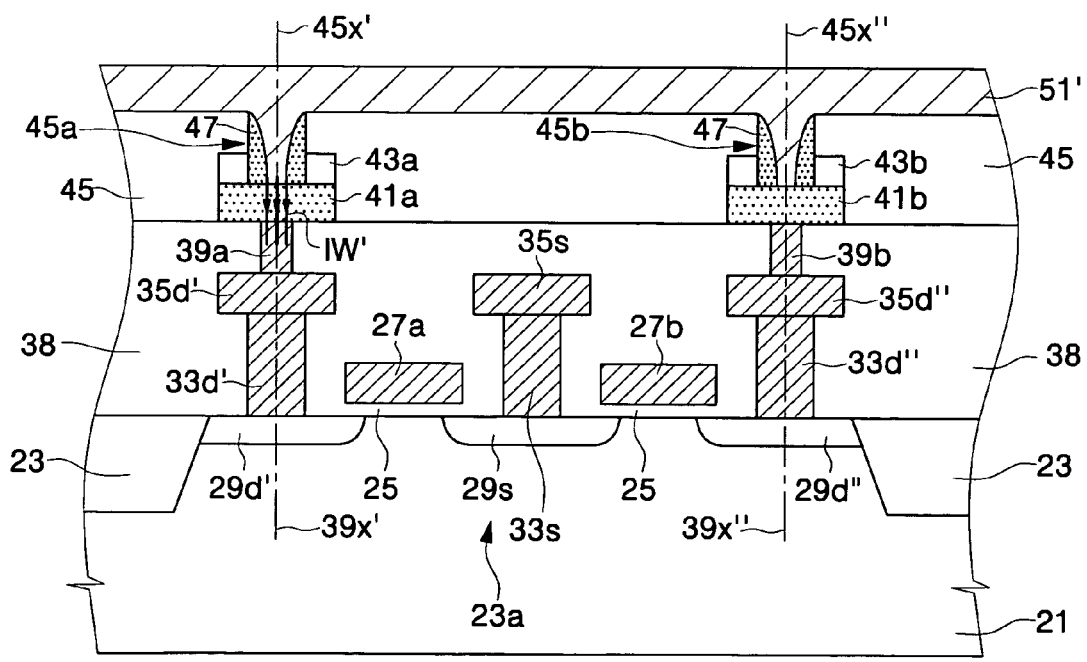
FIG. 2B is a cross-sectional view illustrating a pair of phase changeable memory cells according to an exemplary embodiment of the present invention.

FIG. 2A is a vertical cross-sectional view of phase changeable memory cells according to an exemplary embodiment of the present invention, and FIG. 2B is a vertical cross-sectional view of phase changeable memory cells according to other exemplary embodiments of the present invention.

Referring to FIGS. 2A and 2B, an isolation layer 23 is provided in a predetermined region of a semiconductor substrate 21 to define an active region 23a. A first word line 27a and a second word line 27b are disposed to cross over the active region 23a. The first and second word lines 27a and 27b are electrically insulated from the active region 23a by a gate dielectric layer 25. A common source region 29s is provided in the active region 23a between the first and second word lines 27a and 27b. A first drain region 29d' is provided in the active region 23a which is adjacent to the first word line 27a and located opposite the common source region 29s, and a second drain region 29d" is provided in the active region 23a which is adjacent to the second word line 27b and located opposite the common source region 29s. As a result, the first word line 27a is disposed to cross over a channel region between the first drain region 29d' and the common source region 29s, and the second word line 27b is disposed to cross over a channel region between the second drain region 29d" and the common source region 29s. The first word line 27a, the common source region 29s and the first drain region 29d' constitute a first switching device, i.e., a first access MOS transistor, and the second word line 27b, the common source region 29s and the second drain region 29d" constitute a second switching device, i.e., a second access MOS transistor.

In other exemplary embodiments of the present invention, the first and second switching devices may be a first bipolar transistor and a second bipolar transistor, respectively. In this case, the first and second word lines 27a and 27b may be electrically connected to base regions of the first and second bipolar transistors, respectively.

A lower interlayer dielectric layer 38 is provided on the substrate having the first and second switching devices. A bit line 35s is disposed in the lower interlayer dielectric layer 38. The bit line 35s is electrically connected to the common source region 29s through a source contact plug 33s. The bit line 35s may be disposed parallel to the word lines 27a and 27b when viewed from a plan view. Alternatively, the bit line 35s may be disposed perpendicular to the word lines 27a and 27b when viewed from a plan view. Meanwhile, when the first and second switching devices are the first and second bipolar transistors as described above, the bit line 35s may be electrically connected to emitter regions of the first and second bipolar transistors.

The first drain region 29d' may be electrically connected to a first drain contact plug 33d' in the lower interlayer dielectric layer 38, and the second drain region 29d" may be electrically connected to a second drain contact plug 33d" in the lower interlayer dielectric layer 38. A top surface of the first drain contact plug 33d' may be in contact with a bottom surface of a first drain pad 35d' in the lower interlayer dielectric layer 38, and a top surface of the second drain contact plug 33d" may be in contact with a bottom surface of a second drain pad 35d" in the lower interlayer dielectric layer 38. In addition, a top surface of the first drain pad 35d' may be in contact with a bottom surface of a first lower conductive plug 39a in the lower interlayer dielectric layer 38, and a top surface of the second drain pad 35d" may be in contact with a bottom surface of a second lower conductive plug 39b in the lower interlayer dielectric layer 38. The top surfaces of the first and second lower conductive plugs 39a and 39b may have the same level as the top surface of the lower interlayer dielectric layer 38.

When the first and second switching devices are the first and second bipolar transistors as described above, the first and second lower conductive plugs 39a and 39b may be electrically connected to a collector region of the first bipolar transistor and a collector region of the second bipolar transistor, respectively.

A first phase change material pattern 41a and a second phase change material pattern 41b are provided on the lower interlayer dielectric layer 38. A first hard mask pattern 43a and a second hard mask pattern 43b may be additionally stacked on the first and second phase change material patterns 41a and 41b, respectively. In this case, the first and second hard mask patterns 43a and 43b are self-aligned with the first and second phase change material patterns 41a and 41b, respectively. That is, the first hard mask pattern 43a may have the same width as the first phase change material pattern 41a, and the second hard mask pattern 43b may have the same width as the second phase change material pattern 41b. The first and second hard mask patterns 43a and 43b may be a material layer having an etch selectivity with respect to the first and second phase change material patterns 41a and 41b. For example, the first and second hard mask patterns 43a and 43b may include at least one selected from the group consisting of a silicon oxide layer, a silicon nitride layer and an insulating metal oxide layer. The insulating metal oxide layer may be an aluminum oxide layer or a titanium oxide layer.

As described above, upper electrodes, which are generally employed in conventional phase changeable memory cells, are not provided on the phase change material patterns 41a and 41b of the phase changeable memory cells of the exemplary embodiments of the present invention. The upper electrodes used in the conventional phase changeable memory cell may be typically formed of a metal nitride layer, such as a titanium nitride layer. However, one of the difficulties with conventional phase change memory cells is that the upper electrodes may be lifted during subsequent processes due to poor adhesion between the upper electrodes and the phase change material patterns 41a and 41b. In an attempt to remedy the above difficulties, other conventional phase changeable memory cells have been designed wherein an adhesion layer such as a titanium layer is interposed between the upper electrodes and the phase change material patterns 41a and 41b. The adhesion layer is provided to reinforce adhesion between the upper electrodes and the phase change material patterns 41a and 41b. Nevertheless, with these other conventional devices, metal atoms (e.g., titanium atoms) in the adhesion layer may diffuse into the phase change material patterns 41a and 41b to degrade the characteristics of the phase change material patterns 41a and 41b. However, with the phase changeable memory cells of the exemplary embodiments, the above-mentioned difficulties of the conventional devices, are avoided, since upper electrodes and adhesion layers are not employed with the devices of the exemplary embodiments.

Referring back to the exemplary embodiments of the present invention, the first and second phase change material patterns 41a and 41b are disposed to be in contact with the first and second lower conductive plugs 39a and 39b, respectively. Accordingly, it is preferable that the first and second lower conductive plugs 39a and 39b are composed of a conductive material that does not react with the phase change material patterns 41a and 41b. For instance, the first and second lower conductive plugs 39a and 39b may be a metal layer, a metal nitride layer, or a metal silicide layer. In more detail, the first and second lower conductive plugs 39a and 39b may be comprised of but are not limited to a tungsten (W) layer, a titanium nitride (TiN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium aluminum nitride (TiAlN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum silicon nitride (MoSiN) layer, a molybdenum aluminum nitride (MoAlN) layer, a tantalum silicon nitride (TaSiN) layer, a tantalum aluminum nitride (TaAlN) layer, a titanium (Ti) layer, a molybdenum (Mo) layer, a tantalum (Ta) layer, a titanium silicide (TiSi) layer, a tantalum silicide (TaSi) layer, a titanium tungsten (TiW) layer, a titanium oxynitride (TiON) layer, a titanium aluminum oxynitride (TiAlON) layer, a tungsten oxynitride (WON) layer, a tantalum oxynitride (TaON) layer or a copper (Cu) layer.

Further, the first and second lower conductive plugs 39a and 39b may have a smaller width than the first and second phase change material patterns 41a and 41b. That is, contact areas between the lower conductive plugs 39a and 39b and the phase change material patterns 41a and 41b may be less than the plane areas of the phase change material patterns 41a and 41b respectively. Alternatively, the lower conductive plugs 39a and 39b may have the same width as the phase change material patterns 41a and 41b.

Meanwhile, the phase change material patterns 41a and 41b may be a material layer containing at least one of chalcogenide elements such as tellurium (Te) or selenium (Se). For example, the phase change material patterns 41a and 41b may be a chalcogenide layer such as a GeSbTe layer (hereinafter, a GST layer).

An upper interlayer dielectric layer 45 is provided on the substrate having the hard mask patterns 43a and 43b. The upper interlayer dielectric layer 45 may be a silicon oxide layer, which is widely used as a conventional interlayer dielectric layer. A portion of the first phase change material pattern 41a is in direct contact with a first conductive layer pattern through a first plate line contact hole 45a that penetrates the upper interlayer dielectric layer 45. Moreover, a portion of the second phase change material pattern 41b is in direct contact with a second conductive layer pattern through a second plate line contact hole 45b that penetrates the upper interlayer dielectric layer 45. For example, as shown in FIG. 2A, the first and second phase change material patterns 41a and 41b may be respectively in direct contact with a first upper conductive plug 49a and a second upper conductive plug 49b which passes through the upper interlayer dielectric layer 45. The first and second upper conductive plugs 49a and 49b may be electrically connected to a plate line 51 disposed on the upper interlayer dielectric layer 45. In this case, the plate line 51 may be disposed to cross over the first and second word lines 27a and 27b as shown in FIG. 2A. Alternatively, the first and second upper conductive plugs 49a and 49b may be electrically connected to first and second plate lines respectively which are disposed on the upper interlayer dielectric layer 45. In this case, the first and second plate lines may be disposed parallel to the word lines 27a and 27b, and the bit line 35s may be disposed to cross over the word lines 27a and 27b.

In other exemplary embodiments of the present invention, the first and second phase change material patterns 41a and 41b may be in direct contact with a conductive layer pattern disposed on the upper interlayer dielectric layer 45, i.e., a plate line 51' as shown in FIG. 2B. In this case, the plate line 51' extends to pass through the upper interlayer dielectric layer 45. Alternatively, the first and second phase change material patterns 41a and 41b may be in direct contact with the first and second plate lines respectively which are disposed on the upper interlayer dielectric layer 45. In this case, the first and second plate lines may be disposed parallel to the word lines 27a and 27b, and the bit line 35s may be disposed to cross over the word lines 27a and 27b.

When the first and second hard mask patterns 43a and 43b are stacked on the first and second phase change material patterns 41a and 41b respectively, the upper conductive plugs (49a and 49b of FIG. 2A) or the bit line (51' of FIG. 2B) may penetrate the hard mask patterns 43a and 43b and the upper interlayer dielectric layer 45 to be in direct contact with the phase change material patterns 41a and 41b. Contact areas between the upper conductive plugs 49a and 49b and the phase change material patterns 41a and 41b may be less than the plane areas of the phase change material patterns 41a and 41b. Similarly, contact areas between the plate line 51' and the phase change material patterns 41a and 41b may be less than the plane areas of the phase change material patterns 41a and 41b.

As shown in FIG. 2A, insulating contact spacers 47 may be additionally provided between sidewalls of the upper conductive plugs 49a and 49b and sidewalls of the plate line contact holes 45a and 45b. In this case, the contact areas between the upper conductive plugs 49a and 49b and the phase change material patterns 41a and 41b are further reduced. The insulating contact spacers 47 may be a silicon nitride layer or a silicon oxynitride layer. Similarly, the insulating contact spacers 47 may be interposed between the plate line 51' and sidewalls of the plate line contact holes 45a and 45b, as shown in FIG. 2B.

It is preferable that the upper conductive plugs 49a and 49b are composed of a material layer that does not react with the phase change material patterns 41a and 41b, since the upper conductive plugs 49a and 49b are in direct contact with the phase change material patterns 41a and 41b. For instance, the upper conductive plugs 49a and 49b may be comprised of but are not limited to a tungsten (W) layer, a titanium nitride (TiN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium aluminum nitride (TiAlN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum silicon nitride (MoSiN) layer, a molybdenum aluminum nitride (MoAlN) layer, a tantalum silicon nitride (TaSiN) layer, a tantalum aluminum nitride (TaAlN) layer, a titanium (Ti) layer, a molybdenum (Mo) layer, a tantalum (Ta) layer, a titanium silicide (TiSi) layer, a tantalum silicide (TaSi) layer, a titanium tungsten (TiW) layer, a titanium oxynitride (TiON) layer, a titanium aluminum oxynitride (TiAlON) layer, a tungsten oxynitride (WON) layer, a tantalum oxynitride (TaON) layer or a copper (Cu) layer.

As described above, the bottom surfaces of the phase change material patterns 41a and 41b are in direct contact with the lower conductive plugs 39a and 39b, and the top surfaces of the phase change material patterns 41a and 41b are in direct contact with the upper conductive plugs 49a and 49b or the plate line 51' without the insertion of upper electrodes. In addition to the contact areas between the upper conductive plugs 49a and 49b (or the lower conductive plugs 39a and 39b) and the phase change material patterns 41a and 41b, the contact areas between the plate line 51' and the phase change material patterns 41a and 41b may also be less than the plane areas of the phase change material patterns 41a and 41b. Accordingly, when a write current IW' flows through one selected from the phase change material patterns 41a and 41b (e.g., the first phase change material pattern 41a), the density of the write current IW' in a bulk region of the selected phase change material pattern 41a is significantly increased as compared to the conventional art. As a result, the phase transition efficiency (i.e., thermal generation efficiency) of the selected phase change material pattern 41a of the phase changeable memory cell of the exemplary embodiments is increased. In other words, with the phase changeable memory cell of the exemplary embodiments of the present invention, the writing efficiency of the memory cell is significantly increased and the thermal loss of the selected phase change material pattern 41a is significantly reduced in comparison to conventional phase changeable memory cells, since upper electrodes with high thermal conductivity are not employed with the exemplary embodiments.

In the exemplary embodiment shown in FIG. 2A, when the insulating contact spacers 47 are provided on the sidewalls of the plate line contact holes 45a and 45b, the contact areas between the upper conductive plugs 49a and 49b and the phase change material patterns 41a and 41b may be less than the contact areas between the lower conductive plugs 39a and 39b and the phase change material patterns 41a and 41b. In this case, if the write current IW' flows through the first phase change material pattern 41a, a phase transition occurs at an interface between the first upper conductive plug 49a and the first phase change material pattern 41a. Similarly, in the exemplary embodiment shown in FIG. 2B, when the insulating contact spacers 47 are provided on the sidewalls of the plate line contact holes 45a and 45b, the contact areas between the plate line 51' and the phase change material patterns 41a and 41b may be less than the contact areas between the lower conductive plugs 39a and 39b and the phase change material patterns 41a and 41b. In this case, if the write current IW' flows through the first phase change material pattern 41a, a phase transition occurs at an interface between the plate line 51' and the first phase change material pattern 41a.

The foregoing exemplary embodiments are applicable to both on-axes phase changeable memory cells and off-axes phase changeable memory cells. That is, a vertical central axis 45x' of the first plate line contact hole 45a may be identical to or spaced apart from a vertical central axis 39x' of the first lower conductive plug 39a. Similarly, a vertical central axis 45x" of the second plate line contact hole 45b may be identical to or spaced apart from a vertical central axis 39x" of the second lower conductive plug 39b.

Figure 3A:
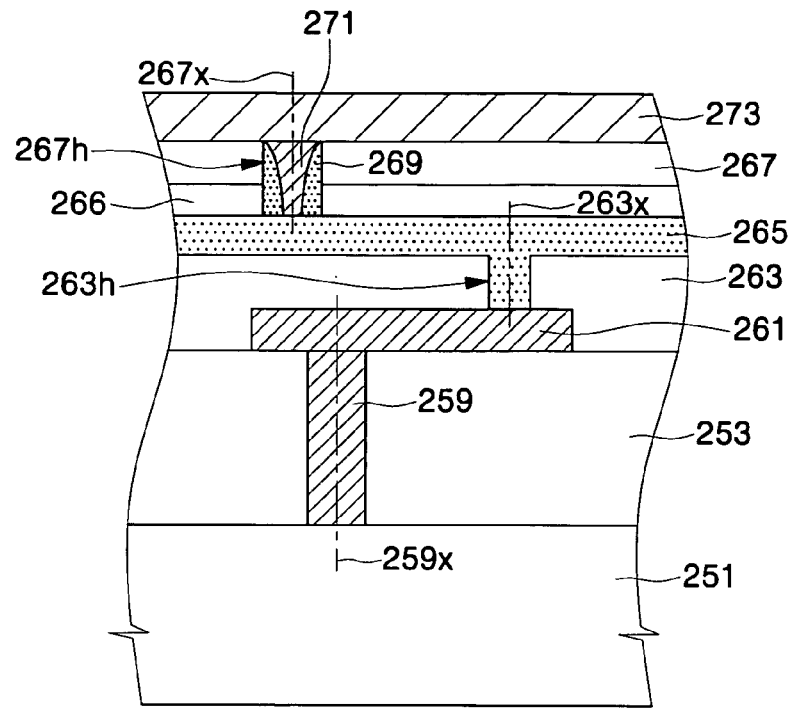
FIG. 3A is a cross-sectional view illustrating a confined phase changeable memory cell according to an exemplary embodiment of the present invention.
Figure 3B:
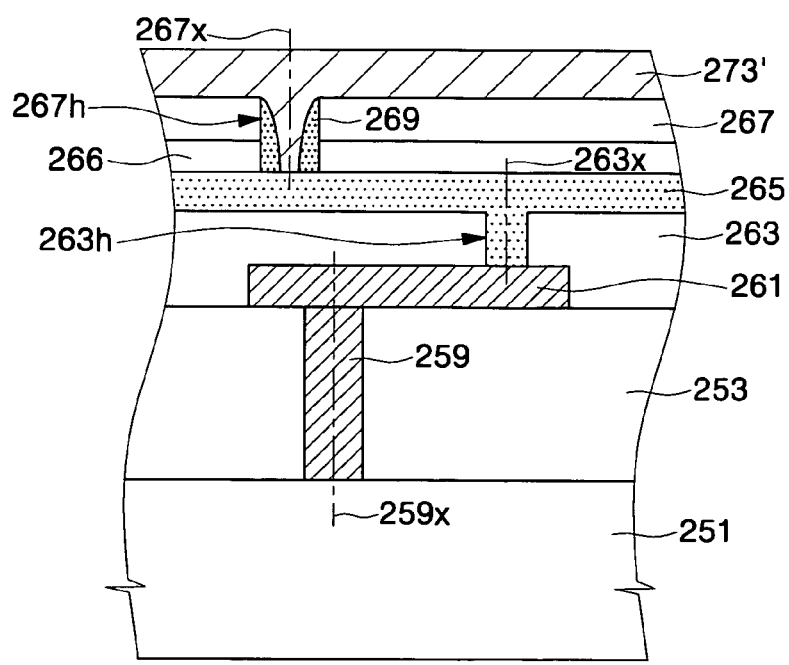
FIG. 3B is a cross-sectional view illustrating a confined phase changeable memory cell according to an exemplary embodiment of the present invention.

Moreover, the foregoing exemplary embodiments are applicable to confined phase changeable memory cells shown in FIGS. 3A and 3B.

Referring to FIGS. 3A and 3B, the switching device described with reference to FIGS. 2A and 2B, i.e., the access MOS transistor or the access bipolar transistor, may be provided at a semiconductor substrate 251. A lower interlayer dielectric layer 253 is disposed on the substrate having the switching device. The switching device is electrically connected to a lower conductive plug 259 that passes through the lower interlayer dielectric layer 253. The lower conductive plug 259 may be the same material layer as the lower conductive plugs 39a and 39b described with reference to FIGS. 2A and 2B. A lower electrode 261 is disposed on the lower interlayer dielectric layer 253. The lower electrode 261 is disposed to cover the lower conductive plug 259. That is, the lower electrode 261 is electrically connected to the lower conductive plug 259. The lower electrode 261 may be a metal nitride layer such as a titanium nitride layer.

The lower electrode 261 and the lower interlayer dielectric layer 253 are covered with a molding layer 263. The molding layer 263 may be an insulating layer such as a silicon oxide layer. A phase change material pattern 265 is disposed on the molding layer 263, and the phase change material pattern 265 is in direct contact with a portion of the lower electrode 261 through a phase change material contact hole 263h that penetrates the molding layer 263. A vertical central axis 263x of the phase change material contact hole 263h may be spaced apart from a vertical central axis 259x of the lower conductive plug 259 as shown in FIGS. 3A and 3B. Alternatively, the vertical central axis 263x of the phase change material contact hole 263h may be identical to the vertical central axis 259x of the lower conductive plug 259.

An upper interlayer dielectric layer 267 is provided on the substrate having the phase change material pattern 265. A hard mask pattern 266 may be provided between the phase change material pattern 265 and the upper interlayer dielectric layer 267. The hard mask pattern 266 may be the same material layer as the hard mask patterns 41a and 41b described with reference to FIGS. 2A and 2B. A portion of the phase change material pattern 265 is in direct contact with a conductive layer pattern through a plate line contact hole 267h that penetrates the upper interlayer dielectric layer 267 and the hard mask pattern 266. For example, the phase change material pattern 265 may be in direct contact with an upper conductive plug 271 that passes through the upper interlayer dielectric layer 267 and the hard mask pattern 266, as shown in FIG. 3A. The upper conductive plug 271 may be electrically connected to a plate line 273 which is disposed on the upper interlayer dielectric layer 267. The upper conductive plug 271 may be the same material layer as the upper conductive plugs 49a and 49b described with reference to FIGS. 2A and 2B.

In other exemplary embodiments of the present invention, the phase change material pattern 265 may be in direct contact with a conductive layer pattern disposed on the upper interlayer dielectric layer 267. In other words, the phase change material pattern 265 may be in direct contact with a plate line 273' disposed on the upper interlayer dielectric layer 267, as shown in FIG. 3B. In this case, the plate line 273' extends to penetrate the upper interlayer dielectric layer 267 and the hard mask pattern 266.

A vertical central axis 267x of the plate line contact hole 267h may be spaced apart from a vertical central axis 263x of the phase change material contact hole 263h. Alternatively, the vertical central axis 267x of the plate line contact hole 267h may be identical to the vertical central axis 263x of the phase change material contact hole 263h.

An insulating contact spacer 269 may be additionally disposed between sidewalls of the upper conductive plug 271 and sidewalls of the plate line contact hole 267h. In this case, a contact area between the upper conductive plug 271 and the phase change material pattern 265 is further reduced. The insulating contact spacer 269 may be composed of a silicon nitride layer or a silicon oxynitride layer. Similarly, the insulating contact spacers 269 may be interposed between the plate line 273' and the sidewalls of the plate line contact hole 267h, as shown in FIG. 3B.

Now, methods of forming phase changeable memory cells according to exemplary embodiments of the present invention will be described.

FIGS. 4 through 8 are vertical cross-sectional views to illustrate methods of forming the phase changeable memory cells shown in FIG. 2A according to exemplary embodiments of the invention.

Figure 4:
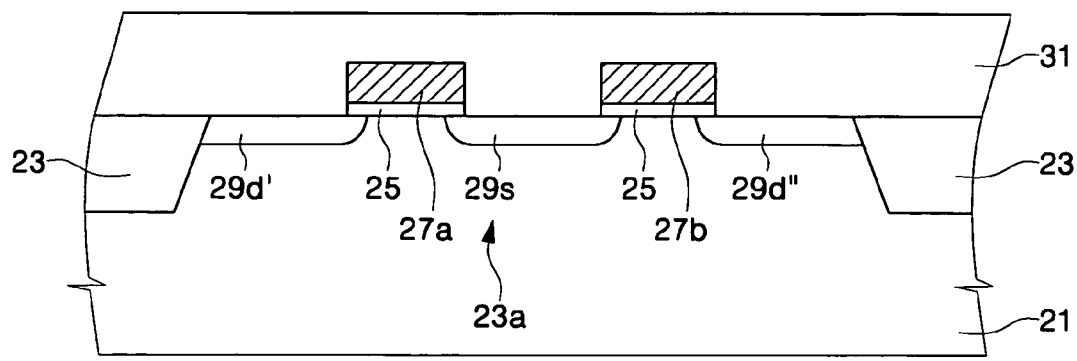
FIGS. 4 through 8 are cross-sectional views to illustrate methods of forming phase changeable memory cells according to an exemplary embodiment of the present invention.

Referring to FIG. 4, an isolation layer 23 is formed in a predetermined region of is a semiconductor substrate 21 to define an active region 23a. A gate dielectric layer 25 is formed on the active region 23a, and a gate conductive layer is formed on the substrate having the gate dielectric layer 25. The gate conductive layer is patterned to form a first gate electrode 27a and a second gate electrode 27b, which are parallel to each other and disposed to cross over the active region 23a. The first and second gate electrodes 27a and 27b may extend to act as first and second word lines respectively.

Impurity ions are implanted into the active region 23a using the word lines 27a and 27b and the isolation layer 23 as ion implantation masks, thereby forming a common source region 29s and first and second drain regions 29d' and 29d". The common source region 29s is formed in the active region 23a between the first and second word lines 27a and 27b. Further, the first drain region 29d' is formed in the active region 23a which is adjacent to the first word line 27a and located opposite the common source region 29s. Moreover, the second drain region 29d" is formed in the active region 23a which is adjacent to the second word line 27b and located opposite the common source region 29s. The first word line 27a, the common source region 29s and the first drain region 29d' constitute a first switching device, i.e., a first access MOS transistor. Similarly, the second word line 27b, the common source region 29s and the second drain region 29d" constitute a second switching device, i.e., a second access MOS transistor. In other exemplary embodiments, the first and second switching devices may be formed to have structures of bipolar transistors. A first lower interlayer dielectric layer 31 is then formed on the substrate having the first and second switching devices.

Figure 5:
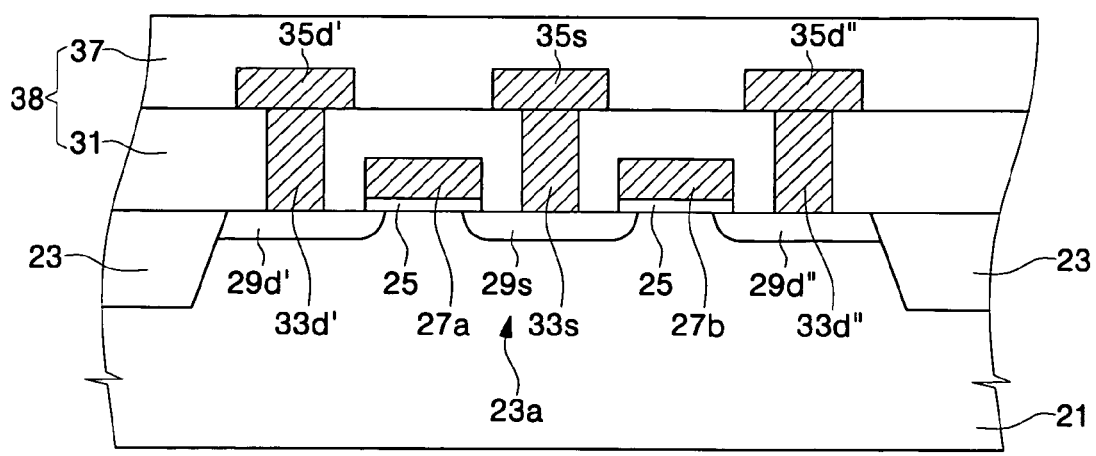

Referring to FIG. 5, the first lower interlayer dielectric layer 31 is patterned to form a common source contact hole, a first drain contact hole and a second drain contact hole that expose the common source region 29s, the first drain region 29d' and the second drain region 29d", respectively. A common source contact plug 33s, a first drain contact plug 33d' and a second drain contact plug 33d" are formed in the respective contact holes using a conventional method.

A conductive layer is formed on the substrate having the contact plugs 33s, 33d' and 33d". The conductive layer is patterned to form a bit line 35s, a first drain pad 35d' and a second drain pad 35d" which cover the common source contact plug 33s, the first drain contact plug 33d' and the second drain contact plug 33d", respectively. The bit line 35s may be formed parallel to the word lines 27a and 27b. Alternatively, the bit line 35s may be formed to cross over the word lines 27a and 27b. A second lower interlayer dielectric layer 37 is formed on the substrate having the bit line 35s and the first and second drain pads 35d' and 35d". The first and second lower interlayer dielectric layers 31 and 37 constitute a lower interlayer dielectric layer 38.

Figure 6:
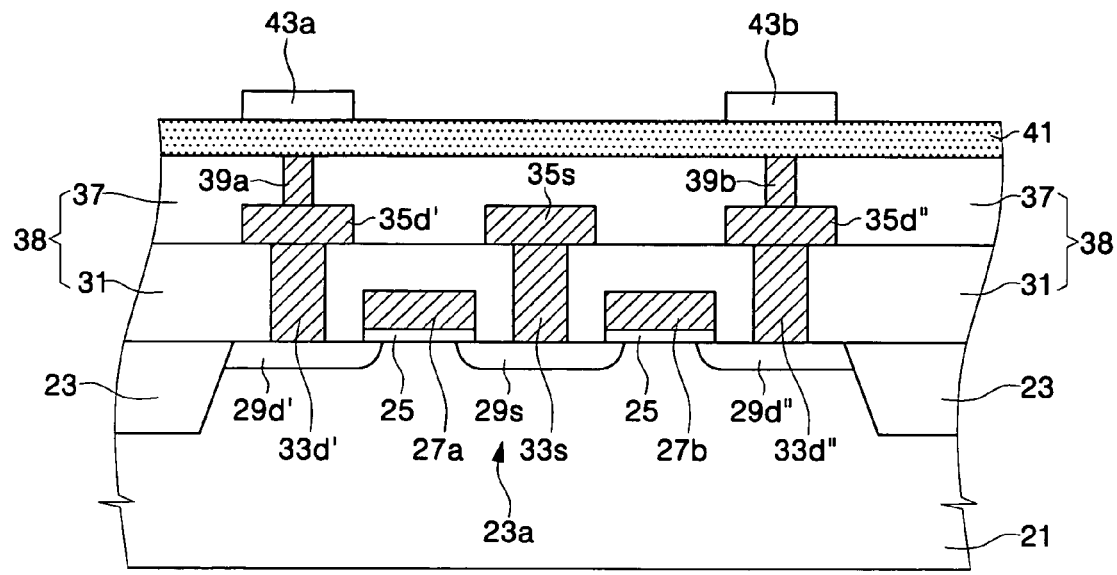

Referring to FIG. 6, the second lower interlayer dielectric layer 37 is patterned to form first and second storage node contact holes that expose the first and second drain pads 35d' and 35d", respectively. A first lower conductive plug 39a and a second lower conductive plug 39b are formed in the first and second storage node contact holes, respectively. A phase change material layer 41 is then formed on the substrate having the lower conductive plugs 39a and 39b. The phase change material layer 41 may be formed of a material layer containing at least one of chalcogenide elements such as tellurium (Te) or selenium (Se). For instance, the phase change material layer 41 may be formed of a chalcogenide layer such as a GST layer. In this case, the lower conductive plugs 39a and 39b are in direct contact with the phase change material layer 41. Accordingly, the lower conductive plugs 39a and 39b may be formed of a conductive layer that does not react with the phase change material layer 41. For example, the lower conductive plugs 39a and 39b may be comprised of but are not limited to a tungsten (W) layer, a titanium nitride (TiN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium aluminum nitride (TiAlN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum silicon nitride (MoSiN) layer, a molybdenum aluminum nitride (MoAlN) layer, a tantalum silicon nitride (TaSiN) layer, a tantalum aluminum nitride (TaAlN) layer, a titanium (Ti) layer, a molybdenum (Mo) layer, a tantalum (Ta) layer, a titanium silicide (TiSi) layer, a tantalum silicide (TaSi) layer, a titanium tungsten (TiW) layer, a titanium oxynitride (TiON) layer, a titanium aluminum oxynitride (TiAlON) layer, a tungsten oxynitride (WON) layer, a tantalum oxynitride (TaON) layer or a copper (Cu) layer.

A hard mask layer may be additionally formed on the phase change material layer 41. The hard mask layer may be formed of an insulating layer having an etch selectivity with respect to the phase change material layer 41. For example, the hard mask layer may be formed of a material layer including at least one selected from the group consisting of a silicon oxide layer, a silicon nitride layer and an insulating metal oxide layer. The silicon oxide layer may be formed of a tetra-ethyl-ortho-silicate (TEOS) layer, and the metal oxide layer may be formed of an aluminum oxide layer or a titanium oxide layer. The hard mask layer is patterned to form a first hard mask pattern 43a and a second hard mask pattern 43b over the first and second lower conductive plugs 39a and 39b, respectively.

Figure 7:
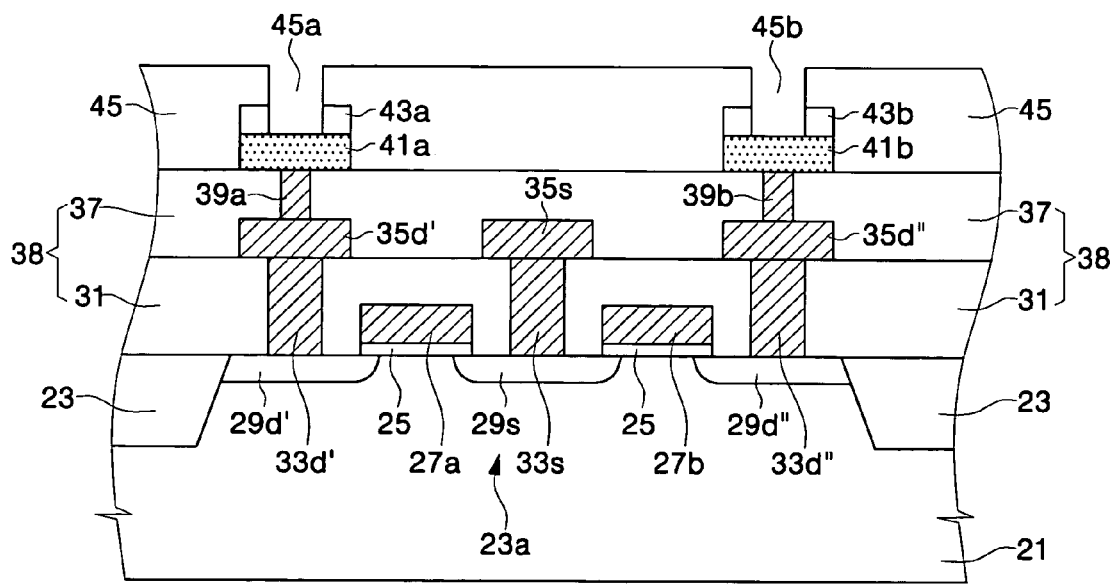

Referring to FIG. 7, the phase change material layer 41 is etched using the hard mask patterns 43a and 43b as etch masks, thereby forming a first phase change material pattern 41a and a second phase change material pattern 41b which are in direct contact with the first and second lower conductive plugs 39a and 39b, respectively. Alternatively, the phase change material patterns 41a and 41b may be formed using a photolithography process without use of the hard mask patterns 43a and 43b.

An upper interlayer dielectric layer 45 is formed on the substrate having the hard mask patterns 43a and 43b. The upper interlayer dielectric layer 45 may be formed of a silicon oxide layer. The upper interlayer dielectric layer 45 and the hard mask patterns 43a and 43b are patterned to form a first plate line contact hole 45a and a second plate line contact hole 45b that expose the first and second phase change material patterns 41a and 41b, respectively. The first plate line contact hole 45a may be formed to have a vertical central axis which is spaced apart from a vertical central axis of the first lower conductive plug 39a. Similarly, the second plate line contact hole 45b may be formed to have a vertical central axis spaced apart from a vertical central axis of the second conductive plug 39b.

Etching damage may be applied to the first and second phase change material patterns 41a and 41b during an etching process for forming the plate line contact holes 45a and 45b. When the etching damage applied is serious, characteristics of the phase change material patterns 41a and 41b may be degraded. Accordingly, the etching process for forming the plate line contact holes 45a and 45b is preferably performed using an etching recipe which is capable of minimizing the etching damage applied to the phase change material patterns 41a and 41b. To minimize the etching damage, it is preferable that the etching process for forming the plate line contact holes 45a and 45b exhibits a high etching selectivity of at least 5. In other words, it is preferable that the etch rate of the upper interlayer dielectric layer 45 and the hard mask patterns 43a and 43b is 5 times as high as that of the phase change material patterns 41a and 41b.

In the exemplary embodiments of the present invention, when the upper interlayer dielectric layer 45 and the hard mask patterns 43a and 43b are formed of a silicon oxide layer and the phase change material patterns 41a and 41b is formed of a GST layer, the etching process for forming the plate line contact holes 45a and 45b may be performed using a first main etch gas of a $C_xH_yF_z$ system and a second main etch gas of a $C_vF_w$ system under a pressure of 10 to 100 mTorr. Further, the etching process may be carried out using a plasma power of 300 to 1000 W. In these exemplary embodiments, the first main etch gas may be a $CHF_3$ gas, a $CH_2F_2$ gas or a $CH_3F$ gas, and the second main etch gas may be a $CF_4$ gas, a $C_4F_6$ gas, a $C_4F_8$ gas or a $C_5F_8$ gas. Moreover, the etching process may be performed with at least one of an argon (Ar) gas, a nitrogen ($N_2$) gas and an oxygen ($O_2$) gas in addition to the first and second main etch gases. In this case, the total flow rate of the first and second main etch gases may be at least 10% of a total flow rate of all of the gases used in the etching process.

Figure 8:
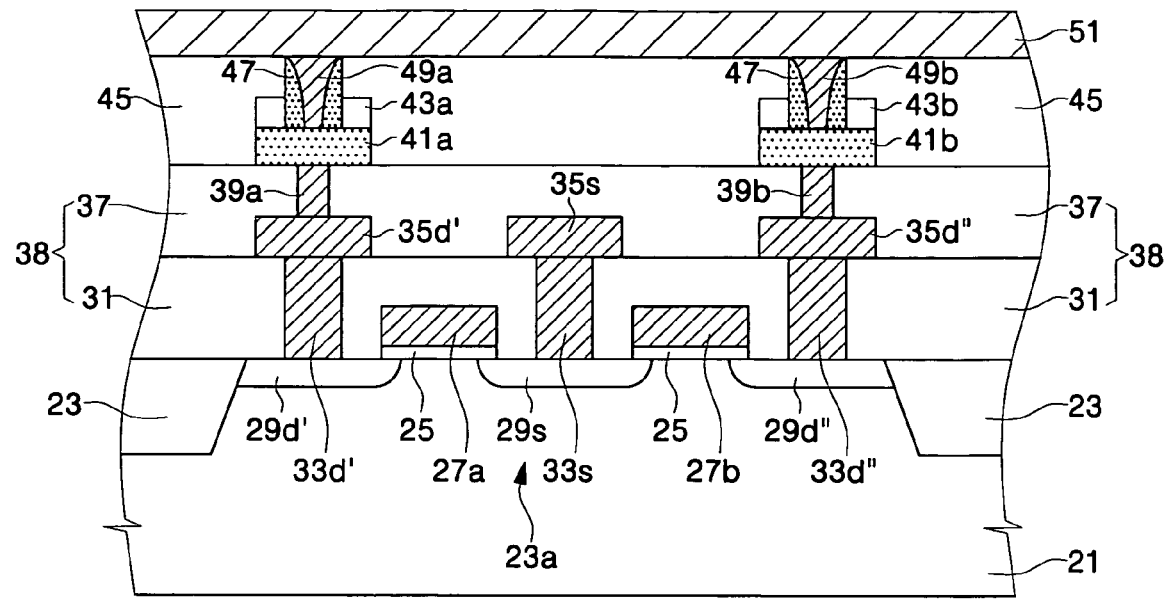

Referring to FIG. 8, a conductive layer is formed on the substrate having the plate line contact holes 45a and 45b, and the conductive layer is etched back to expose a top surface of the upper interlayer dielectric layer 45. As a result, a first upper conductive plug 49a and a second upper conductive plug 49b are formed in the first and second plate line contact holes 45a and 45b, respectively. The first and second upper conductive plugs 49a and 49b are formed to be in direct contact with the first and second phase change material patterns 41a and 41b, respectively. Accordingly, the upper conductive plugs 49a and 49b may also be formed of a conductive layer that does not react with the phase change material patterns 41a and 41b. For example, the upper conductive plugs 49a and 49b may be comprised of but are not limited to a tungsten (W) layer, a titanium nitride (TiN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium aluminum nitride (TiAlN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum silicon nitride (MoSiN) layer, a molybdenum aluminum nitride (MoAlN) layer, a tantalum silicon nitride (TaSiN) layer, a tantalum aluminum nitride (TaAlN) layer, a titanium (Ti) layer, a molybdenum (Mo) layer, a tantalum (Ta) layer, a titanium silicide (TiSi) layer, a tantalum silicide (TaSi) layer, a titanium tungsten (TiW) layer, a titanium oxynitride (TiON) layer, a titanium aluminum oxynitride (TiAlON) layer, a tungsten oxynitride (WON) layer, a tantalum oxynitride (TaON) layer or a copper (Cu) layer.

In other exemplary embodiments of the present invention, insulating contact spacers 47 may be formed on sidewalls of the plate line contact holes 45a and 45b prior to deposition of the conductive layer for forming the first and second upper conductive plugs 49a and 49b. The insulating contact spacers 47 may be formed of a silicon nitride layer or a silicon oxynitride layer.

Subsequently, a plate layer is formed on the substrate having the upper conductive plugs 49a and 49b, and the plate layer is patterned to form a plate line 51 which is electrically connected to the first and second upper conductive plugs 49a and 49b.

In still other exemplary embodiments, the process of forming the upper conductive plugs 49a and 49b may be omitted. In this case, the plate line 51 is formed to be in direct contact with the first and second phase change material patterns 41a and 41b through the plate line contact holes 45a and 45b.

Now, methods of forming confined phase changeable memory cells according to exemplary embodiments of the present invention will be described with reference to FIGS. 3A and 3B.

Referring again to FIGS. 3A and 3B, a switching device is formed at a semiconductor substrate 251. The switching device can be formed using the same manners as described with reference to FIG. 4. A lower interlayer dielectric layer 253 is formed on the substrate having the switching device. A lower conductive plug 259 is formed to pass through the lower interlayer dielectric layer 253. The lower conductive plug 259 is electrically connected to the switching device. A lower electrode 261 is formed on the lower interlayer dielectric layer 253. The lower electrode 261 is formed to be in contact with the lower conductive plug 259. A molding layer 263 is formed on the substrate having the lower electrode 261. The molding layer 263 may be formed of an insulating layer such as a silicon oxide layer.

The molding layer 263 is patterned to form a phase change material contact hole 263h that exposes a portion of the lower electrode 261. The phase change material contact hole 263h may be formed to have a vertical central axis 263x spaced apart from a vertical central axis 259x of the lower conductive plug 259. A phase change material pattern 265 is formed on the molding layer 263 to fill the phase change material contact hole 263h. Additionally, a hard mask pattern 266 may also be formed on the phase change material pattern 265. The hard mask pattern 266 and the phase change material pattern 265 can be formed in the same manner as described above with reference to FIGS. 6 and 7. Also, an upper interlayer dielectric layer 267 is formed on the substrate having the hard mask pattern 266.

The upper interlayer dielectric layer 267 and the hard mask pattern 265 are patterned to form a plate line contact hole 267h that exposes a portion of the phase change material pattern 265. An etching process of forming the plate line contact hole 267h may be performed using the etching recipe described with reference to FIG. 7. The plate line contact hole 267h may be formed to have a vertical central axis 267x spaced apart from a vertical central axis 263x of the phase change material contact hole 263h. An insulating contact spacer 269 may be formed on a sidewall of the plate line contact hole 267h. The insulating contact spacer 269 may be formed of an insulating layer such as a silicon oxide layer or a silicon oxynitride layer. An upper conductive plug 271 is then formed to fill the plate line contact hole 267h. The upper conductive plug 271 may be formed using the method of forming the upper conductive plugs 49a and 49b shown in FIG. 8. As a result, the phase change material pattern 265 is formed to be in direct contact with the upper conductive plug 271 that passes through the upper interlayer dielectric layer 267 and the hard mask pattern 266. A plate line 273 is then formed on the upper interlayer dielectric layer 267. The plate line 273 may be formed to cover the upper conductive plug 271.

In other exemplary embodiments of the present invention, the process of forming the upper conductive plug 271 may be omitted. In this case, a plate line 273', which is in direct contact with the phase change material pattern 265, is formed on the upper interlayer dielectric layer 267, as shown in FIG. 3B.

EXAMPLES

Figure 9:
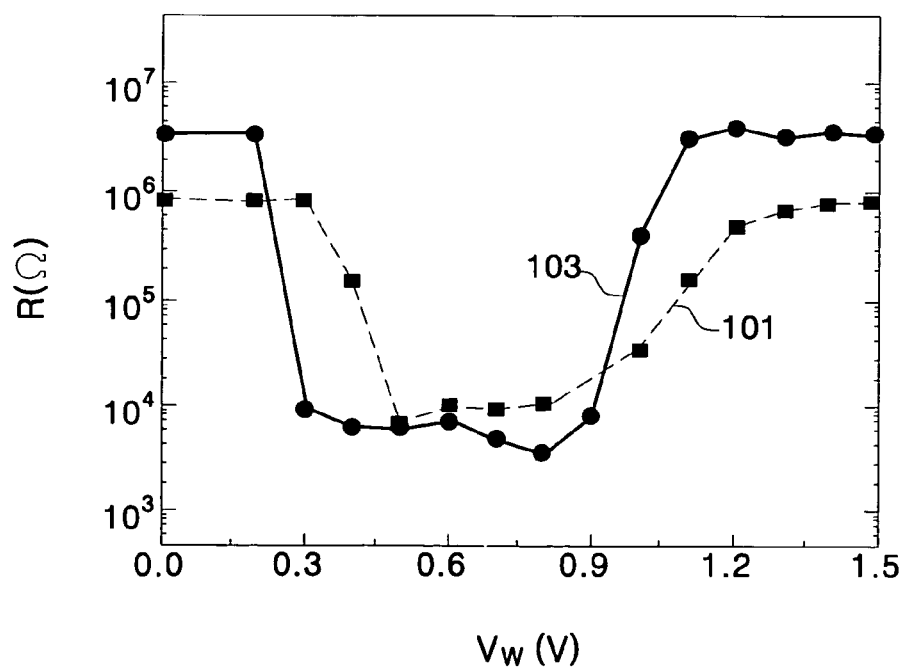
FIG. 9 is a graph illustrating switching characteristics of a conventional phase changeable memory cell and a phase changeable memory cell according to an exemplary embodiment of the present invention.

FIG. 9 is a graph showing the writing characteristics (program characteristics) of data storage elements according to the conventional art and an exemplary embodiment of the present invention. In FIG. 9, a horizontal axis denotes a writing voltage $V_W$ which is applied between an upper conductive plug and a lower conductive plug of each of the data storage elements, and a vertical axis denotes an electrical resistance R of each of the data storage elements. Also, in FIG. 9, data indicated by a reference numeral 101 corresponds to the program characteristics of the conventional data storage element, and data indicated by a reference numeral 103 corresponds to the program characteristics of the data storage element of an exemplary embodiment of the present invention.

The data storage elements exhibiting the measurement results of FIG. 9 were fabricated using the process conditions described in the following Table.

TABLE

| | | Conventional Art | Present Invention |
|---|---|---|---|
| Lower conductive plug | Material | TiN layer | TiN layer |
| | Diameter | 55 nm | 55 nm |

TABLE-continued

| | | Conventional Art | Present Invention |
|---|---|---|---|
| Phase change material pattern | Material | GST layer | GST layer |
| | Diameter | 680 nm | 680 nm |
| | Thickness | 100 nm | 100 nm |
| Upper electrode | | TiN layer | — |
| Hard mask pattern | | SiO layer | SiO layer |
| Upper interlayer dielectric layer | | SiO layer | SiO layer |
| Upper conductive plug | Material | W layer | W layer |
| | Diameter | 240 nm | 240 nm |

With the conventional data storage element mentioned above, the upper electrode was formed to have the same width (diameter) as the phase change material pattern. That is, the upper electrode was self-aligned with the phase change material pattern. In this case, the upper conductive plug was formed to contact the upper electrode.

However, with the data storage element according to the exemplary embodiments of the present invention, the hard mask pattern was formed of a silicon oxide (SiO) layer and the hard mask pattern was self-aligned with the phase change material pattern. That is, the hard mask pattern was formed to have the same width (diameter) as the phase change material pattern. In this case, the upper conductive plug was formed to penetrate the hard mask pattern. In other words, the upper conductive plug was formed to be in direct contact with the phase change material pattern.

Further, in fabrication of the data storage element according to the exemplary embodiments of the present invention, a plate line contact hole exposing a portion of the phase change material pattern was formed by successively patterning the upper interlayer dielectric layer and the hard mask pattern using an oxide etch process. The oxide etch process was carried out using a magnetic enhanced reactive ion etch (MERIE) apparatus under a pressure of 10 mTorr and a plasma power of 500 W. In this case, a $CHF_3$ gas and a $CF_4$ gas were used as main etch gases, and flow rates of the $CHF_3$ gas and the $CF_4$ gas were 40 sccm and 10 sccm, respectively.

In FIG. 9, the writing voltage $V_W$ at each data point was applied to the data storage element for about 500 ns (nanoseconds).

Referring to FIG. 9, the conventional data storage element exhibited a set resistance of about $1 \times 10^4$ ohm after a writing voltage $V_W$ of about 0.5 V was applied for 500 ns, and the conventional data storage element exhibited a reset resistance of about $1 \times 10^6$ ohm after a writing voltage $V_W$ of about 1.2 V was applied for 500 ns.

Meanwhile, the data storage element of the exemplary embodiments of the present invention exhibited a set resistance of about $1 \times 10^4$ ohm after a low writing voltage $V_W$ of about 0.3 V was applied for 500 ns, and the data storage element of the present invention exhibited a high reset resistance of about $4 \times 10^6$ ohm after a low writing voltage $V_W$ of about 1.1 V was applied for 500 ns.

In conclusion, the data storage element according to the exemplary embodiments of the present invention exhibited relatively lower set/reset voltages and a relatively higher reset resistance as compared to the conventional data storage element.

According to the exemplary embodiments of the present invention as described above, a phase change material pattern is in direct contact with an upper conductive plug or a plate line which penetrates an upper interlayer dielectric layer, without the insertion of an upper electrode. Thus, the density of a writing current that flows through the bulk region of the phase change material pattern of the phase changeable memory cell of the exemplary embodiments is increased, thereby also enhancing the writing efficiency of the phase changeable memory cell.

Having described the exemplary embodiments of the present invention, it is further noted that various modifications may be made herein without departing from the spirit and scope of the present invention as defined by the metes and bounds of the appended claims.

What is claimed is:

1. A phase changeable memory cell, comprising:
a lower interlayer dielectric layer formed on a semiconductor substrate;
a lower conductive plug passing through the lower interlayer dielectric layer;
another lower conductive plug spaced apart from the lower conductive plug;
a phase change material pattern disposed on the lower interlayer dielectric layer to contact the lower conductive plug;
another phase change material pattern disposed on the lower interlayer dielectric layer to contact the other lower conductive plug;
an upper interlayer dielectric layer covering the phase change material pattern, the other phase change material pattern and the lower interlayer dielectric layer; and
a conductive layer pattern disposed on the upper interlayer dielectric layer in direct contact with the phase change material pattern and the other phase change material pattern through plate line contact holes that penetrate the upper interlayer dielectric layer, wherein the conductive layer pattern comprises:
a first upper conductive plug filling a first plate line contact hole that penetrates the upper interlayer dielectric layer and being in direct contact with the phase change material pattern;
a second upper conductive plug filling a second plate line contact hole that penetrates the upper interlayer dielectric layer and being in direct contact with the other phase change material pattern; and
a plate line disposed on the upper interlayer dielectric layer, wherein the first and second upper conductive plugs are in direct contact with the plate line.

2. The phase changeable memory cell according to claim 1, wherein the lower conductive plug has a smaller width than the phase change material pattern.

3. The phase changeable memory cell according to claim 1, further comprising an insulating contact spacer interposed between a sidewall of the conductive layer pattern and a sidewall of the plate line contact hole.

4. The phase changeable memory cell according to claim 1, further comprising a hard mask pattern interposed between the upper interlayer dielectric layer and a top surface of the phase change material pattern, wherein the conductive layer pattern penetrates the upper interlayer dielectric layer and the hard mask pattern.

5. The phase changeable memory cell according to claim 4, wherein the hard mask pattern comprises at least one selected from a group consisting of a silicon oxide layer, a silicon nitride layer and an insulating metal oxide layer.

6. The phase changeable memory cell according to claim 1, wherein the lower conductive plug has a vertical central axis spaced apart from a vertical central axis of the conductive layer pattern in the plate line contact hole.

7. The phase changeable memory cell according to claim 1, wherein the conductive layer pattern is only a single layer of one selected from a group consisting of a metal layer, a metal nitride layer and a metal silicide layer.

8. The phase changeable memory cell according to claim 1, wherein a first contact area between the conductive layer pattern and the phase change material pattern is less than a second contact area between the lower conductive plug and the phase change material pattern.

9. A phase changeable memory cell, comprising:
a lower interlayer dielectric layer formed on a semiconductor substrate;
a lower conductive plug passing through the lower interlayer dielectric layer;
a lower electrode disposed on the lower interlayer dielectric layer in contact with the lower conductive plug;
a molding layer covering the lower electrode and the lower interlayer dielectric layer;
a phase change material pattern formed on the molding layer, the phase change material pattern being in contact with the lower electrode through a phase change material contact hole that penetrates the molding layer;
another phase change material pattern formed on the molding layer and spaced apart from the phase change material pattern;
an upper interlayer dielectric layer formed on the substrate having the phase change material pattern and the other phase change material pattern;
a conductive layer pattern disposed on the upper interlayer dielectric layer in direct contact with the phase change material pattern and the other phase change material pattern through plate line contact holes that penetrate the upper interlayer dielectric layer; and
a hard mask pattern interposed between the phase change material pattern and the upper interlayer dielectric layer, wherein the conductive layer pattern passes through the upper interlayer dielectric layer and the hard mask pattern.

10. The phase changeable memory cell according to claim 9, further comprising an insulating contact spacer interposed between a sidewall of the plate line contact hole and the conductive layer pattern in the plate line contact hole.

11. A phase changeable memory cell, comprising:
an isolation layer formed in a predetermined region of a semiconductor substrate to define an active region;
a switching device formed in the active region;
a lower interlayer dielectric layer formed on the substrate having the switching device;
a lower conductive plug penetrating the lower interlayer dielectric layer, the lower conductive plug being electrically connected to the switching device;
a lower electrode disposed on the lower interlayer dielectric layer in contact with the lower conductive plug;
a molding layer covering the lower electrode and the lower interlayer dielectric layer;
a phase change material pattern formed on the molding layer, the phase change material pattern being in contact with the lower electrode through a phase change material contact hole that penetrates the molding layer;
another phase change material pattern formed on the molding layer and spaced apart from the phase change material pattern;
an upper interlayer dielectric layer formed on the substrate having the phase change material pattern and the other phase change material pattern;
a plate line disposed on the upper interlayer dielectric layer in direct contact with the phase change material pattern and the other phase change material pattern through plate line contact holes that penetrate the upper interlayer dielectric layer; and a hard mask pattern interposed between the phase change material pattern and the upper interlayer dielectric layer, wherein the plate line passes through the upper interlayer dielectric layer and the hard mask pattern.

12. The phase changeable memory cell according to claim 11, further comprising an insulating contact spacer interposed between the plate line in the plate line contact hole and a sidewall of the plate line contact hole.

13. The phase changeable memory cell according to claim 11, wherein the plate line is comprised of one selected from a group consisting of a tungsten (W) layer, a titanium nitride (TiN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium aluminum nitride (TiAlN) layer, a titanium boron is nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum silicon nitride (MoSiN) layer, a molybdenum aluminum nitride (MoAlN) layer, a tantalum silicon nitride (TaSiN) layer, a tantalum aluminum nitride (TaAlN) layer, a titanium (Ti) layer, a molybdenum (Mo) layer, a tantalum (Ta) layer, a titanium silicide (TiSi) layer, a tantalum silicide (TaSi) layer, a titanium tungsten (TiW) layer, a titanium oxynitride (TiON) layer, a titanium aluminum oxynitride (TiAlON) layer, a tungsten oxynitride (WON) layer, a tantalum oxynitride (TaON) layer and a copper (Cu) layer.

* * * * *